(12) United States Patent
Lee et al.

(10) Patent No.: US 6,765,269 B2
(45) Date of Patent: Jul. 20, 2004

(54) CONFORMAL SURFACE SILICIDE STRAP ON SPACER AND METHOD OF MAKING SAME

(75) Inventors: Eric Lee, Vancouver, WA (US); Dave Cobert, Hillsboro, OR (US); Wanqing Cao, Portland, OR (US)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 09/772,115

(22) Filed: Jan. 26, 2001

(65) Prior Publication Data

US 2002/0102845 A1 Aug. 1, 2002

(51) Int. Cl.[7] .............................................. H01L 29/94
(52) U.S. Cl. ........................ 257/383; 257/382; 257/384
(58) Field of Search ................................. 257/288, 296, 257/668, 369, 368, 327, 382, 383, 384

(56) References Cited

U.S. PATENT DOCUMENTS

| | | | | |
|---|---|---|---|---|
| 5,008,723 A | * | 4/1991 | van der Have | 357/23.7 |
| 5,190,893 A | * | 3/1993 | Jones, Jr. et al. | 437/192 |
| 5,302,552 A | | 4/1994 | Duchateau et al. | 437/200 |
| 5,387,535 A | * | 2/1995 | Wilmsmeyer | 437/57 |
| 5,654,575 A | * | 8/1997 | Jeng | 257/384 |
| 5,728,625 A | | 3/1998 | Tung | 438/586 |
| 5,736,461 A | | 4/1998 | Berti et al. | 438/651 |
| 5,897,372 A | * | 4/1999 | Howard | 438/637 |
| 5,909,617 A | * | 6/1999 | Manning et al. | 438/238 |
| 5,911,114 A | | 6/1999 | Naem | 438/684 |
| 5,918,145 A | | 6/1999 | Rodder | 438/622 |
| 5,940,714 A | * | 8/1999 | Lee et al. | 438/396 |
| 6,033,978 A | | 3/2000 | Fujii et al. | 438/621 |
| 6,037,204 A | | 3/2000 | Chang et al. | 438/231 |
| 6,054,394 A | * | 4/2000 | Wang | 438/753 |
| 6,063,704 A | | 5/2000 | Demirlioglu | 438/664 |
| 6,100,191 A | | 8/2000 | Lin et al. | 438/661 |
| 6,121,138 A | * | 9/2000 | Wieczorek et al. | 438/682 |
| 6,159,833 A | * | 12/2000 | Lee et al. | 438/585 |
| 6,436,805 B1 | * | 8/2002 | Trivedi | 438/618 |
| 2002/0048946 A1 | * | 4/2002 | Tang et al. | 438/682 |

OTHER PUBLICATIONS

"A 2.9 $\mu m^2$ Embedded SRAM Cell with Co–Salicide Direct–Strap Technology for 0.18 $\mu m$ High Performance CMOS Logic", Noda et al., 1997 IEEE.

* cited by examiner

Primary Examiner—Steven Loke
Assistant Examiner—Douglas W. Owens
(74) Attorney, Agent, or Firm—Bever, Hoffman & Harms, LLP

(57) ABSTRACT

A semiconductor structure is provided that includes a gate, a dielectric spacer located adjacent to a sidewall of the gate, a source/drain region, and a continuous silicide strap located over the gate, the dielectric spacer and the source/drain region. The silicide strap provides an electrical connection between the gate and the source drain region. In one embodiment, the silicide strap is formed by a method that includes the steps of (1) implanting a semiconductor material, such as silicon, into upper surfaces of the gate, the dielectric spacer, and the source/drain region, (2) depositing a refractory metal over the implanted semiconductor material, and (3) reacting the refractory metal with the implanted semiconductor material, thereby forming the continuous silicide strap at the upper surfaces of the gate, the dielectric spacer and the source/drain region. Advantageously, the dielectric spacer does not need to be removed prior to forming the silicide strap.

18 Claims, 6 Drawing Sheets

CONFORMAL SURFACE SILICIDE STRAP ON SPACER AND METHOD OF MAKING SAME

FIELD OF THE INVENTION

The present invention relates to interconnect structures in a semiconductor device. More specifically, the present invention relates to an interconnect strap located over a spacer of a semiconductor structure.

RELATED ART

FIGS. 1A–1D are cross sectional views illustrating the fabrication of a conventional interconnect strap. As illustrated in FIG. 1A, gate oxide 102, gate electrodes 103–104, and silicon nitride spacers 105–108 are formed over substrate 101. Lightly doped regions 109–110 and dielectric 111 are formed in substrate 101. As illustrated in FIG. 1B, photoresist layer 112 is coated, exposed and developed, such that an opening 113 is formed through photoresist layer 112, exposing spacer 106. An etch step is then performed, thereby removing spacer 106 through opening 113. As illustrated in FIG. 1C, photoresist layer 112 is stripped, and source/drain implant steps are performed, thereby forming source/drain regions 114–115. As illustrated in FIG. 1D, self-aligned $CoSi_2$ is formed on source/drain regions 114–115 and gate electrodes 103–104 using high temperature sputtering and in-situ vacuum annealing. Gate electrode 103 and source/drain region 114 are connected by $CoSi_2$ strap 116, which is formed where spacer 106 was removed.

Disadvantages associated with the process of FIGS. 1A–1D are as follows. First, additional processing is required to selectively and completely remove spacer 106. This additional processing may present challenges depending on the composition of the spacer material and the intermediate film between spacer 106 and substrate 101, especially since photoresist layer 112 must remain in place during the removal process. Incomplete removal of spacer 106 will result in failure to form continuous $CoSi_2$ strap 116, because $CoSi_2$ will not form over remaining portions of spacer 106 (i.e., silicon nitride).

In addition, increased junction leakage will result underneath $CoSi_2$ strap 116 because the source/drain implant must be performed after spacer 106 is selectively removed and before the $CoSi_2$ is deposited. As a result, source/drain region 114 fully overlaps the lightly doped region 109 under gate electrode 103, thereby resulting in a shallow and abrupt diode junction underneath $CoSi_2$ strap 116.

Furthermore, CoSi2 must be formed on a vertical sidewall of gate electrode 103. Inadequate cobalt deposition step coverage will result in failure to form a continuous $CoSi_2$ strap 116.

It would therefore be desirable to have a silicide strap that couples a gate electrode to a source/drain region, while overcoming the above-described shortcomings of the prior art.

SUMMARY

Accordingly, the present invention provides a method for forming a low-resistance local interconnect structure over an insulator such as a sidewall spacer dielectric. In one embodiment, the method involves fabricating a low-resistance surface strap having a relatively small area between a MOSFET polysilicon gate area and an adjacent source/drain silicon area.

A semiconductor structure is provided that includes a gate, a dielectric spacer located adjacent to a sidewall of the gate, a source/drain region, and a continuous silicide strap located over the gate, the dielectric spacer and the source/drain region. The silicide strap provides an electrical connection between the gate and the source drain region.

In one embodiment, the silicide strap is formed by a method that includes the steps of (1) implanting a semiconductor material, such as silicon, into upper surfaces of the gate, the dielectric spacer, and the source/drain region, (2) depositing a refractory metal over the implanted semiconductor material, and (3) reacting the refractory metal with the implanted semiconductor material, thereby forming the continuous silicide strap at the upper surfaces of the gate, the dielectric spacer and the source/drain region.

This method differs from the prior art, because the low resistance strap is formed on the surface of a spacer that is left intact instead of being removed by additional process steps prior to strap formation. In addition, the source/drain regions are completely formed prior to the formation of the strap, thereby eliminating problems associated with shallow diode junctions being formed under the strap.

The present invention will be more fully understood in view of the following description and drawings.

DETAILED DESCRIPTION

Figure 1A:
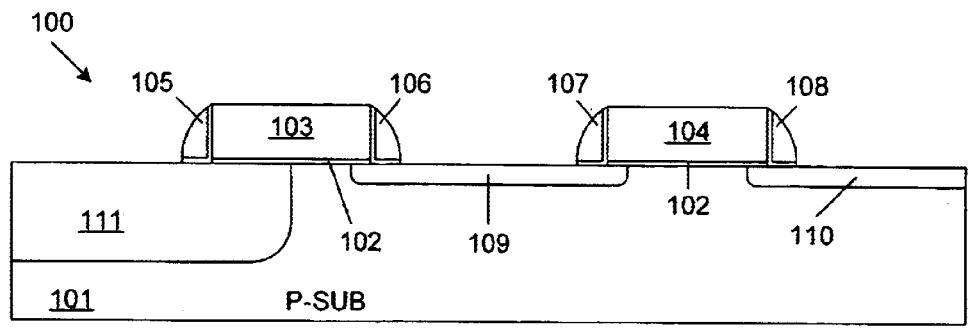
FIGS. 1A–1D are cross sectional views illustrating the fabrication of a conventional interconnect strap.
Figure 1B:
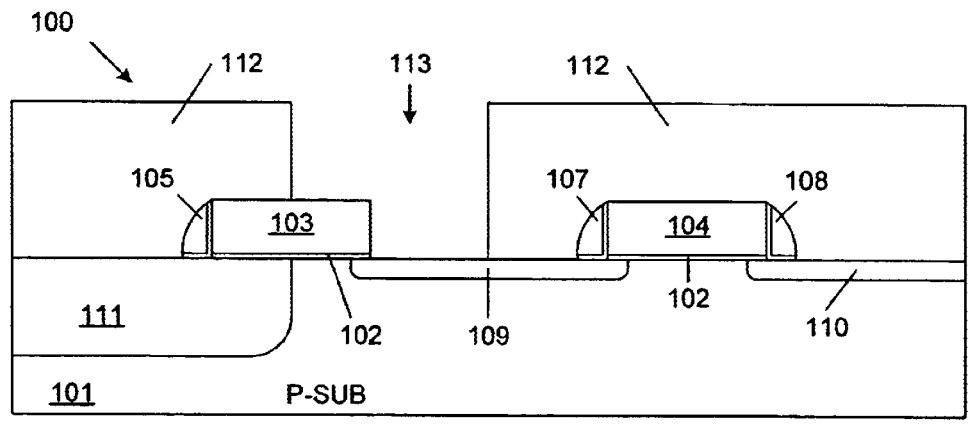
Figure 1C:
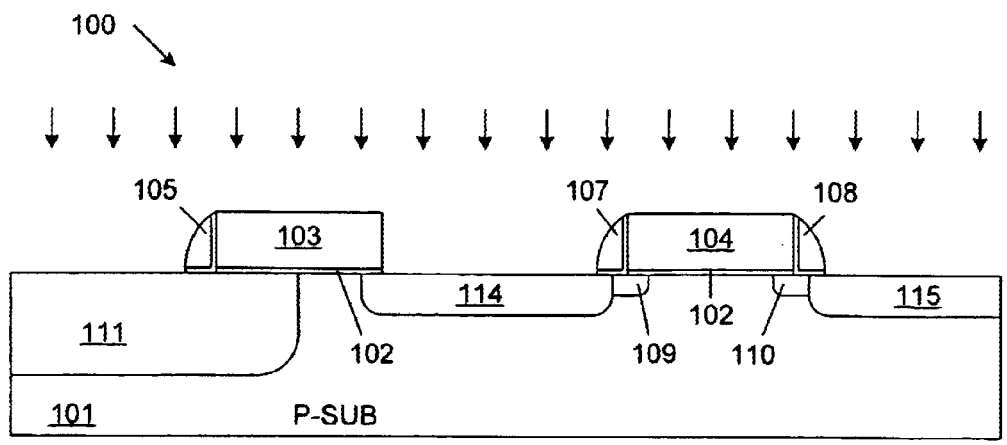
Figure 1D:
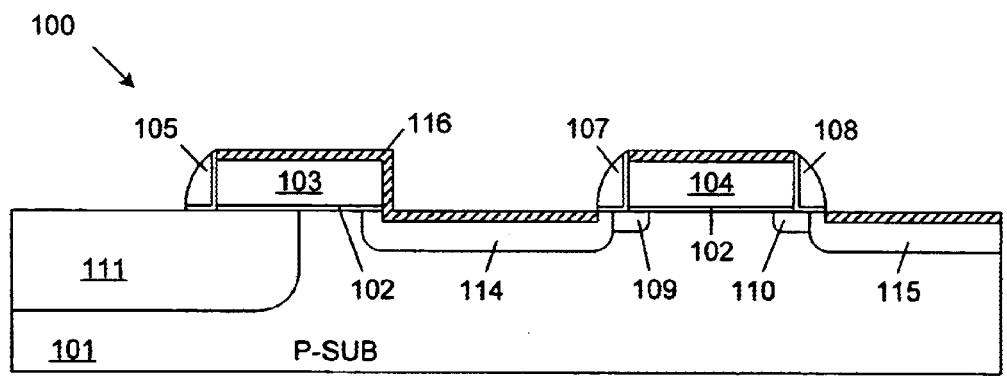
Figure 2A:
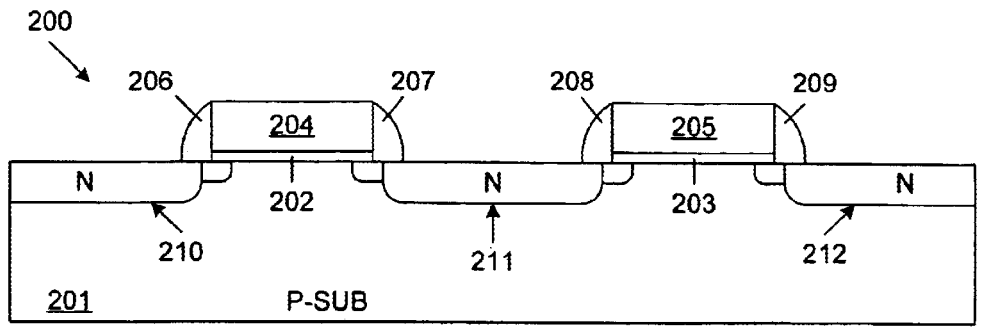
FIGS. 2A–2I are cross sectional views illustrating the fabrication of a silicide strap over a sidewall spacer in accordance with one embodiment of the present invention.

FIG. 2A is a cross sectional view of a CMOS structure 200, which includes p-type semiconductor substrate 201, gate dielectric layers 202–203, gate electrodes 204–205, dielectric sidewall spacers 206–209 and n-type source/drain regions 210–212. The structure of FIG. 2A is fabricated using conventional CMOS processing techniques, which are well known to one of ordinary skill in the art.

In the described embodiment, substrate 201 is p-type monocrystalline silicon, and gate dielectric layers 202–203 are thermally grown silicon oxide layers. In addition, gate electrodes 204–205 are conductively doped polycrystalline silicon. In the described embodiment, gate electrodes 204–205 have a length of about 0.18 microns. However, gate dimensions of less than 0.18 microns can be used in other embodiments, assuming that overlay is tightly controlled. Sidewall spacers 206–209 can be either silicon nitride ($Si_3N_4$) or silicon oxide ($SiO_2$) with varying stoichiometries of the bulk film being deposited on the sidewall. In a particular embodiment, sidewall spacers 206–209 are formed from a silicon-rich oxide or nitride. Silicon rich oxide or nitride has an atomic silicon content greater than the silicon content of exactly stoichiometric $SiO_2$ or $Si_3N_4$. As will become apparent in view of the disclosure below, a silicon-rich spacer material will promote the subsequent formation of a silicide strap over spacer 207. Source/drain regions 210–212 include lightly doped n-type regions, which extend under gate electrodes 204–205, as well as more heavily doped n-type regions which can provide contact regions for a subsequently formed interconnect structure (not shown). Advantageously, source/drain regions 210–212 are completely formed by this early step of the process.

Figure 2B:
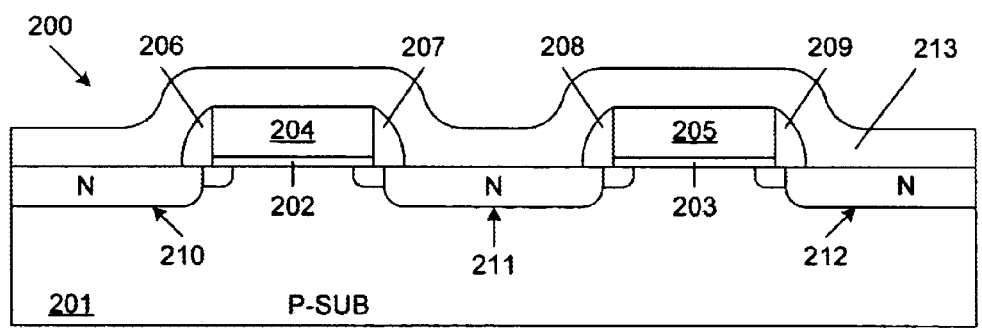

As illustrated in FIG. 2B, a conformal insulating layer, which is hereinafter referred to as silicon blocking layer 213, is deposited over the structure of FIG. 2A. In the described embodiment, silicon-blocking layer 213 is silicon oxide or silicon nitride, having a thickness of at least 10 nm. Silicon-blocking layer 213 may be deposited using conventional PECVD (plasma enhanced CVD) at temperatures of about 400° C. LPCVD (low pressure thermal CVD) at temperatures of about 700° C. may also be used. Either process may be used to deposit TEOS, $SiO_2$ or $Si_3N_4$ to a thickness greater than 10 nm. As described in more detail below, silicon-blocking layer 213 will be used as a mask during a subsequent silicon implant step.

Figure 2C:
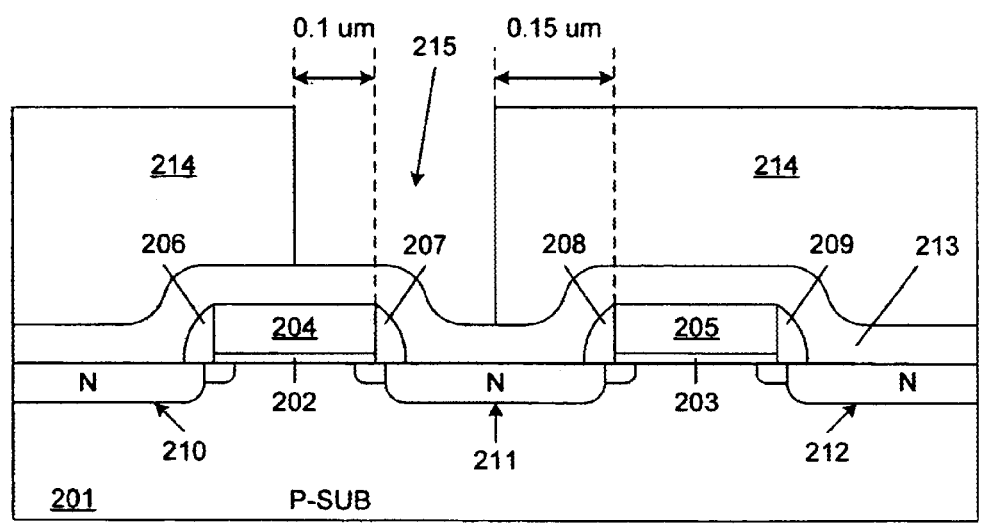

As illustrated in FIG. 2C, a photoresist layer 214 is coated over the upper surface of silicon blocking layer 213. Photoresist layer 214 is exposed and developed, thereby forming opening 215. As described in more detail below, opening 215 defines the location of a subsequently formed silicide strap. FIG. 2C further illustrates spacing requirements of opening 215 in accordance with one embodiment of the present invention. In the described embodiment, there must be at least 0.1 microns from the right edge of gate 204 to the left edge of opening 215. This ensures that the subsequently formed strap will properly contact gate electrode 204. In addition, there must be at least 0.15 microns from the left edge of gate electrode 205 to the right edge of opening 215. This ensures that the subsequently formed strap will not contact gate electrode 205.

Figure 2D:
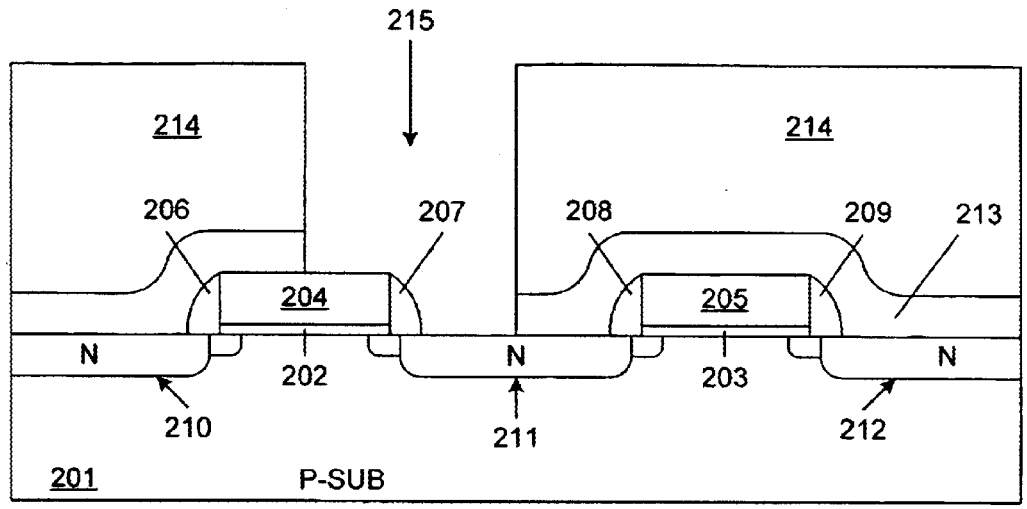

As illustrated in FIG. 2D, silicon blocking layer 213 is etched through opening 215 of photoresist layer 214, thereby exposing a portion of gate electrode 204, sidewall spacer 207, and a portion of source/drain region 211. This etch can involve a chemical etch or a reactive ion etch. This etch must be selective with respect to the material present in sidewall spacer 207, thereby minimizing the loss of spacer 207 during the etch. Silicon-blocking layer 213 (silicon nitride) is removed using an anisotropic reactive ion etch (RIE) at a pressure of about 200 mT, a power of about 180 W, and a mixture of $AR/CF_4/O_2$ gasses.

Figure 2E:
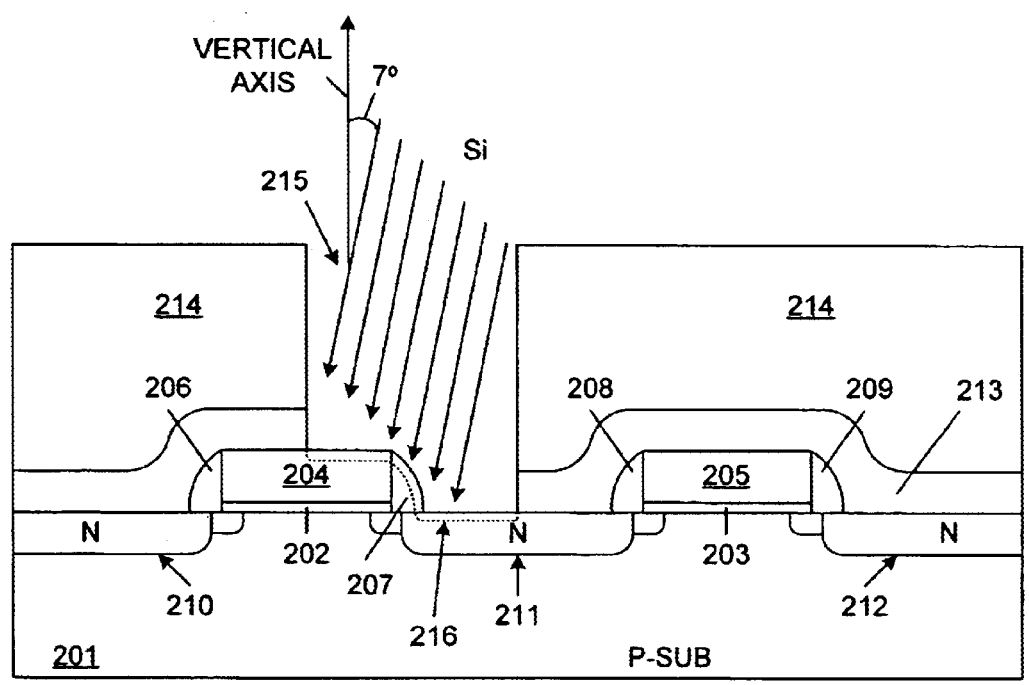

As illustrated in FIG. 2E, a silicon implant is performed through opening 215. This silicon implant is performed at a sufficiently high dose and low energy, thereby providing a peak silicon concentration of at least 55% near the exposed surface of dielectric spacer 207. In one embodiment, the silicon implant is performed at a dose of 7E15 ions/$cm^2$, energy of 10 KeV and a tilt angle of about 7 degrees with respect to the vertical axis in FIG. 2E (with substrate 201 being subjected to four 90° rotations about the vertical axis)

At the end of the silicon implantation, a silicon region 216 exists at the upper exposed surfaces of gate electrode 204, spacer 207 and source/drain region 211. The silicon implant therefore modifies the surface of dielectric spacer 207 such that it is possible to form silicide on the surface of spacer 207. That is, the silicon implant provides seed material for silicide formation over the spacer dielectric, thereby enabling the formation of low resistance silicide on a surface where silicide would not otherwise form. The silicon implant also serves to amorphize the exposed surfaces of gate 204 and source/drain region 211, which is beneficial for silicide formation. Although the present invention is described using a silicon implant step, it is understood that other semiconductor material, such as Germanium (Ge), can be deposited in other embodiments.

Figure 2F:
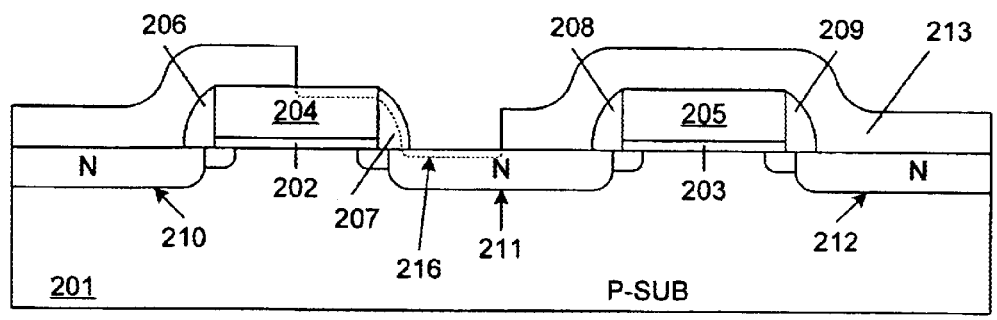

As illustrated in FIG. 2F, photoresist layer 214 is stripped and the upper surface of the resulting structure is cleaned. In one embodiment, a wet cleaning process is used wherein the structure is immersed in, or sprayed with, dilute aqueous HF acid at 25° C. The HF dilution is between 1% and 10% in one embodiment.

In an alternate embodiment, the silicon implant step can be performed after photoresist layer 214 is stripped. In this case, silicon-blocking layer 213 is used as an implant hardmask to prevent the implantation of silicon outside of the area exposed by opening 215. In this embodiment, silicon-blocking layer 213 must have a thickness of at least 100 nm.

Figure 2G:
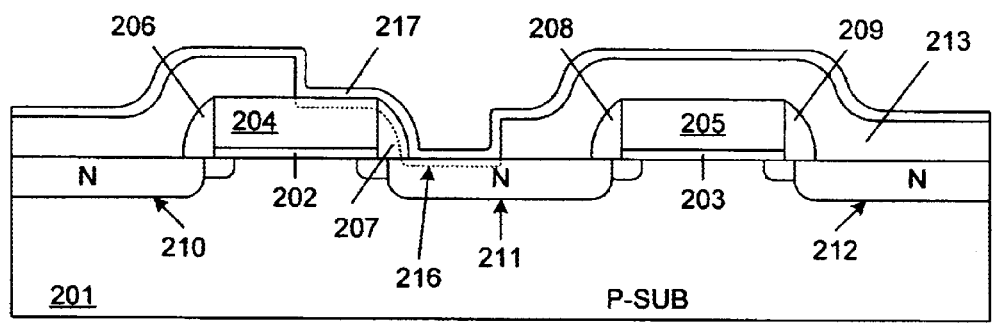

As illustrated in FIG. 2G, a refractory metal layer 217 is deposited over the resulting structure. In the described embodiment, refractory metal layer 217 includes cobalt (Co) and titanium nitride (TiN), and has a thickness of 10 nm or greater, depending on the step coverage. In one embodiment, Co is deposited first with a thickness between 5 nm and 20 nm using PVD processing. Process temperatures should be maintained between 0 and 200° C. Without breaking vacuum in the deposition chamber, TiN is deposited over the Co to a thickness of 15 to 30 nm using PVD processing. In other embodiments, TiN may not be necessary to cover the reactive metal (i.e., Co). The step coverage of sidewall spacer 207 should be maximized to increase the eventual silicide thickness on sidewall spacer 207. In other embodiments, other refractory metals, such as titanium or nickel can be used in place of cobalt. Note that the TiN layer is not required when titanium is used in place of cobalt.

Figure 2H:
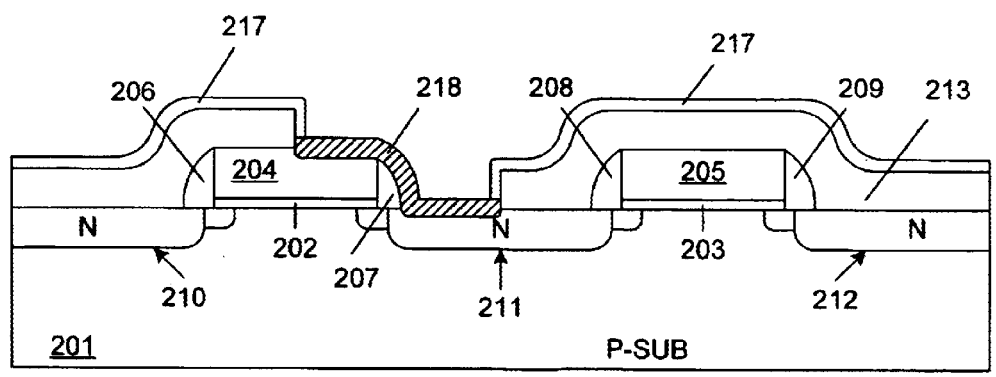

As illustrated in FIG. 2H, an anneal is performed, thereby causing the refractory metal layer to react with underlying silicon region 216 to form silicide (i.e., $CoSi_x$) strap 218. In one embodiment, a high temperature anneal (i.e., temperature >800° C.), is performed to promote Co/Si creep. Co/Si creep refers to the diffusion of silicon atoms into the cobalt film. Increased Co/Si creep increases the thickness of a $CoSi_2$ strap which is formed during the anneal, thereby reducing the final resistance of the strap. As mentioned above, if spacer 207 is originally fabricated from a silicon-rich dielectric material, the silicide formation will be promoted during this step.

Figure 2I:
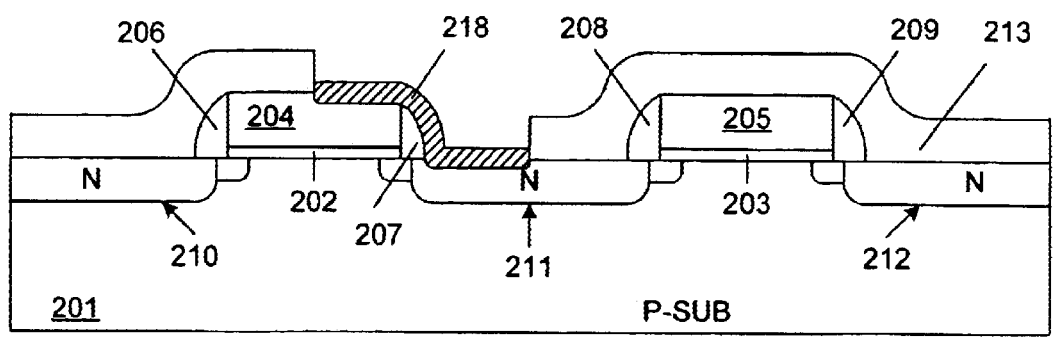

As illustrated in FIG. 2I, a selective etch is performed after the anneal step, thereby removing the un-reacted portions of refractory metal layer 217. In one embodiment, the selective etch is performed using an SPM Piranha ($H_2SO_4$/$H_2O_2$) and SC-1 ($DI/H_2O_2/NH_4/OH$ 5:1:05) solution. After this selective etch is performed, metal silicide strap 218 remains over the upper surface of gate electrode, sidewall spacer 207 and source/drain region 211. Silicide strap 218 provides a low-resistance connection between gate electrode 204 and source/drain region 211.

Processing can then continue using conventional CMOS processing techniques.

Note that compared to a conventional CMOS process flow, the present invention requires the deposition of an additional dielectric film in order to form silicon block layer 213 and the processing of one additional photoresist layer 214. The present invention can therefore be easily integrated into a conventional CMOS process. The present invention is therefore a low cost and readily manufacturable technology feature.

Although the invention has been described in connection with several embodiments, it is understood that this invention is not limited to the embodiments disclosed, but is capable of various modifications that would be apparent to a person skilled in the art. For example, although the described examples describe the formation of a silicide strap from a gate to a source/drain region, it is understood that the silicide strap can provide connections to other structures over a dielectric spacer. Thus, the invention is limited only by the following claims.

What is claimed is:

1. A semiconductor structure comprising:
   a semiconductor substrate,
   a conductive element located over the semiconductor substrate;
   a dielectric spacer located adjacent to a sidewall of the conductive element, wherein an upper surface of the dielectric spacer is silicon-rich, and a portion of the dielectric spacer, located away from the upper surface of the dielectric spacer, is not silicon-rich; and
   a continuous refractory metal layer directly contracting the conductive element, the dielectric spacer and the semiconductor substrate.

2. The semiconductor structure of claim 1, wherein the refractory metal layer directly contacts amorphous silicon in the conductive element, the dielectric spacer and the semiconductor substrate.

3. The semiconductor structure of claim 1, wherein the conductive element is a gate electrode.

4. The semiconductor structure of claim 3, further comprises a gate dielectric layer located between the semiconductor substrate and the gate electrode.

5. The semiconductor structure of claim 1, further comprising a source/drain region located in the semiconductor substrate, wherein the refractory metal layer contacts the source/drain region.

6. The semiconductor structure of claim 1, wherein the dielectric spacer comprises silicon oxide or silicon nitride.

7. The semiconductor structure of claim 1, wherein the refractory metal layer comprises cobalt.

8. A semiconductor structure comprising:
   a semiconductor substrate;
   a conductive element located over the semiconductor substrate;
   a dielectric spacer located adjacent to a sidewall of the conductive element,
   a semiconductor region dispersed in the upper surfaces of the conductive element, the dielectric spacer and the semiconductor substrates; and
   a continuous refractory metal layer located directly on the semiconductor region.

9. The semiconductor structure of claim 8, wherein the dielectric spacer is silicon-rich.

10. The semiconductor structure of claim 8, wherein the semiconductor region comprises amorphous silicon.

11. The semiconductor structure of claim 8, wherein the semiconductor region comprises an implanted semiconductor layer.

12. The semiconductor structure of claim 11, wherein the implanted semiconductor layer comprises silicon.

13. The semiconductor structure of claim 8, wherein the conductive element is a gate electrode.

14. The semiconductor structure of claim 13, further comprises a gate dielectric layer located between the semiconductor and the gate electrode.

15. The semiconductor structure of claim 8, further comprising a source/drain region located in the semiconductor substrate, wherein the refractory metal layer contacts the source/drain region.

16. The semiconductor structure of claim 8, wherein the dielectric spacer comprises silicon oxide or silicon nitride.

17. The semiconductor structure of claim 8, wherein the refractory metal layer comprises cobalt.

18. The semiconductor structure of claim 8, wherein the upper surface of the dielectric spacer is silicon-rich, and wherein a portion of the dielectric spacer, located away from the upper surface of the dielectric spacer, is not silicon-rich.

* * * * *